US010483073B2

(12) United States Patent
Koch et al.

(10) Patent No.: US 10,483,073 B2
(45) Date of Patent: Nov. 19, 2019

(54) FABRICATION OF VACUUM ELECTRONIC COMPONENTS WITH SELF-ALIGNED DOUBLE PATTERNING LITHOGRAPHY

(71) Applicant: Elwha LLC, Bellevue, WA (US)

(72) Inventors: Andrew T. Koch, Seattle, WA (US); Andrew R. Lingley, Seattle, WA (US); Max N. Mankin, Seattle, WA (US); Tony S. Pan, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 157 days.

(21) Appl. No.: 15/458,785

(22) Filed: Mar. 14, 2017

(65) Prior Publication Data

US 2017/0263409 A1 Sep. 14, 2017

Related U.S. Application Data

(60) Provisional application No. 62/308,034, filed on Mar. 14, 2016.

(51) Int. Cl.
*H05K 3/02* (2006.01)
*H01J 9/02* (2006.01)
*H01J 9/18* (2006.01)

(52) U.S. Cl.
CPC .................. *H01J 9/02* (2013.01); *H01J 9/18* (2013.01); *H01J 2209/012* (2013.01); *Y10T 29/49156* (2015.01)

(58) Field of Classification Search
CPC ......... H01L 21/30604; H01L 27/10844; Y10S 438/947; Y10S 438/942; Y10S 977/742; Y10T 29/49156; Y10T 29/49151; Y10T 29/49155; B82Y 40/00; G03F 7/0002
USPC .................. 29/847, 33 K, 527.1, 592.1, 835
See application file for complete search history.

(56) References Cited

U.S. PATENT DOCUMENTS 7,087,532 B2 * 8/2006 Dobuzinsky ........ H01L 21/3081 257/E21.206
7,531,456 B2 5/2009 Kwon et al.
7,795,149 B2 * 9/2010 Sandhu .................. B82Y 10/00 430/312

OTHER PUBLICATIONS

Natarajan, S., Agostinelli, M., Akbar, S., Bost, M., Bowonder, A., Chikarmane, V., Chouksey, S., Dasgupta, A., Fischer, K., Fu, Q. and Ghani, T., Dec. 2014. A 14nm logic technology featuring 2 nd-generation FinFET, air-gapped interconnects, self-aligned double patterning and a 0.0588 μ2 SRAM cell size. *In Electron Devices Meeting* (*IEDM*), 2014 *IEEE International* (pp. 3-7). IEEE, Dec. 15-17, 2014.

(Continued)

*Primary Examiner* — Thiem D Phan

(57) ABSTRACT

The present disclosure relates to methods of fabricating electronic devices or components thereof. The electronic devices can be vacuum electronic devices. The methods can include disposing a first material on or in a substrate. The methods can further include removing a portion of the first material to form one or more structure protruding from the substrate. The methods can further include disposing a second material onto the one or more structure of the first material, and then removing a portion of the second material to form one or more sidewall structures. A second portion of the one or more structures of the first material can also be removed to form a fabricated structure including the substrate and one or more sidewall structures protruding therefrom.

23 Claims, 10 Drawing Sheets

(56) References Cited

OTHER PUBLICATIONS

Choi, Y.K., King, T.J. and Hu, C., A spacer patterning technology for nanoscale CMOS. *IEEE Transactions on Electron Devices*, 49(3), Mar. 2002, pp. 436-441.

* cited by examiner

FABRICATION OF VACUUM ELECTRONIC COMPONENTS WITH SELF-ALIGNED DOUBLE PATTERNING LITHOGRAPHY

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

CROSS-REFERENCE TO RELATED APPLICATIONS

The present application claims the benefit of the earliest available effective filing date(s) from the following listed application(s) (the "Priority Applications"), if any, listed below (e.g., claims earliest available priority dates for other than provisional patent applications, or claims benefits under 35 U.S.C. § 119(e) for provisional patent applications, for any and all parent, grandparent, great-grandparent, etc. applications of the Priority Application(s)).

PRIORITY APPLICATIONS

The present application claims benefit of priority of U.S. Provisional Patent Application No. 62/308,034, entitled FABRICATION OF VACUUM ELECTRONIC COMPONENTS WITH SELF-ALIGNED DOUBLE PATTERNING ("SADP") LITHOGRAPHY, naming Andrew T. Koch, Andrew R. Lingley, Max N. Mankin, and Tony S. Pan as inventors, filed 14, 03, 2016, which was filed within the twelve months preceding the filing date of the present application or is an application of which a currently co-pending priority application is entitled to the benefit of the filing date.

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications (including U.S. Provisional Patent Application No. 62/308,034) and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

TECHNICAL FIELD

The present disclosure relates to methods of fabricating devices and components of devices. More specifically, the present disclosure relates to methods of fabricating components of vacuum electronic devices. Use of the fabrication methods for other types of devices is also contemplated.

SUMMARY

The present disclosure relates to methods of fabricating devices and components of devices. In one embodiment, the present disclosure relates to methods of fabricating vacuum electronic devices or components thereof. The methods can include disposing a first material on or in a substrate. The methods can further include removing a portion of the first material to form one or more structures protruding from the substrate. The methods can further include disposing a second material onto the one or more structures of the first material. In certain embodiments, the second material forms a conformal coating or layer on the one or more structures of the first material. The methods can further include removing a portion of the second material to form one or more sidewall structures. A second portion of the one or more structures of the first material can then be removed to form a fabricated structure including the substrate and one or more sidewall structures of the second material protruding therefrom. In some embodiments, the one or more sidewall structures are free-standing structures.

In certain embodiments, the fabricated structure can be used as a component of a vacuum electronic device. For example, the fabricated structure can be used as a grid that can be disposed between a cathode and an anode. In other embodiments, the fabricated structure comprises a grid and an electrode (e.g., cathode or anode). In some embodiments, the fabricated structure can be disposed as an electrode in a vacuum electronic device. In still other embodiments, the fabricated structure is subjected to one or more additional fabrication steps or processes. For example, the fabricated structure can be further etched and/or reduced to achieve a fabricated structure having one or more desired parameters.

In another embodiment disclosed herein, the fabricated structure is used to imprint an imprint material to form a template or stamp that can be used for forming components of a vacuum electronic device. For example, the fabricated structure can be used as a stamp for nanoimprint lithography. In such embodiments, the template having an imprinted structure formed from the nanoimprint process can be used as a template to define a pattern for fabricating a component of a vacuum electronic device. For example, the template can be used to define a pattern for a grid component.

In yet another embodiment, the fabricated structure can be used as an etch mask for forming one or more components of a vacuum electronic device. For example, the fabricated structure can include a film stack that is disposed between the one or more sidewall structures and the substrate. Through vertical etching techniques, the one or more sidewall structures can function as an etch mask to pattern and/or etch the film stack into a desired structure.

In still another embodiment, the fabricated structure is used as a support structure for one or more components of a vacuum electronic device. For example, the fabricated structure, including the one or more sidewall structures, can be used to support another material (such as a layer or film layer of material). In particular embodiments, the supported material can function as a grid for use in a vacuum electronic device. Additional embodiments are further disclosed below.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The written disclosure herein describes illustrative embodiments that are non-limiting and non-exhaustive. Reference is made to certain of such illustrative embodiments that are depicted in the figures, in which.

DETAILED DESCRIPTION

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

Thus, the following detailed description of the embodiments of the disclosure is not intended to limit the scope of the disclosure, as claimed, but is merely representative of possible embodiments. In addition, the steps of a method do not necessarily need to be executed in any specific order, or even sequentially, nor do the steps need to be executed only once.

The present disclosure relates to methods of fabricating devices and components of devices. In some embodiments, the present disclosure relates to methods of fabricating components (e.g., grids) of vacuum electronic devices (although use of the fabrication methods for other applications is also contemplated). In certain embodiments, for example, vacuum electronic devices (and/or the components thereof) employ one or more grids that are fabricated and/or used in close proximity to an electrode (i.e., an electrode-grid structure). Exemplary grids include, but are not limited to, control grids, acceleration grids, suppression grids, deflection grids, etc., and exemplary electrodes include cathodes and anodes. In some embodiments, the methods disclosed herein can be used in the fabrication of such grids.

In some vacuum electronic devices, a grid and an electrode may be separated by nanometers or microns. The grid can also be made of a conductive material such that it can vary the electric potential, trajectory, and/or energy of an electron or other charged particle traveling near and/or through it. An illustrative electrode/grid structure is described in U.S. Pat. No. 8,575,842, issued Nov. 5, 2013 and titled Field Emission Device, which is incorporated by reference herein in its entirety.

In various instances, the parameters (including, but not limited to, the dimensions, geometries, and/or sizes) of one or more features of the components used in vacuum electronic devices can also range from nanometers to microns. And in further instances, the parameters of one or more features can determine and/or affect the performance of the component and/or device. Accordingly, a fabrication process that provides control (and in some instances fine-tuned control) over the parameters of the one or more features can be advantageous in many ways.

Disclosed herein are methods of fabrication that provide control over various parameters and features of a fabricated structure. For example, as further detailed below, the methods can provide control over the pitch or distance between features such as sidewall structures. The methods can also provide control over the width (or thickness) and/or height of the sidewall structures.

Figure 1:
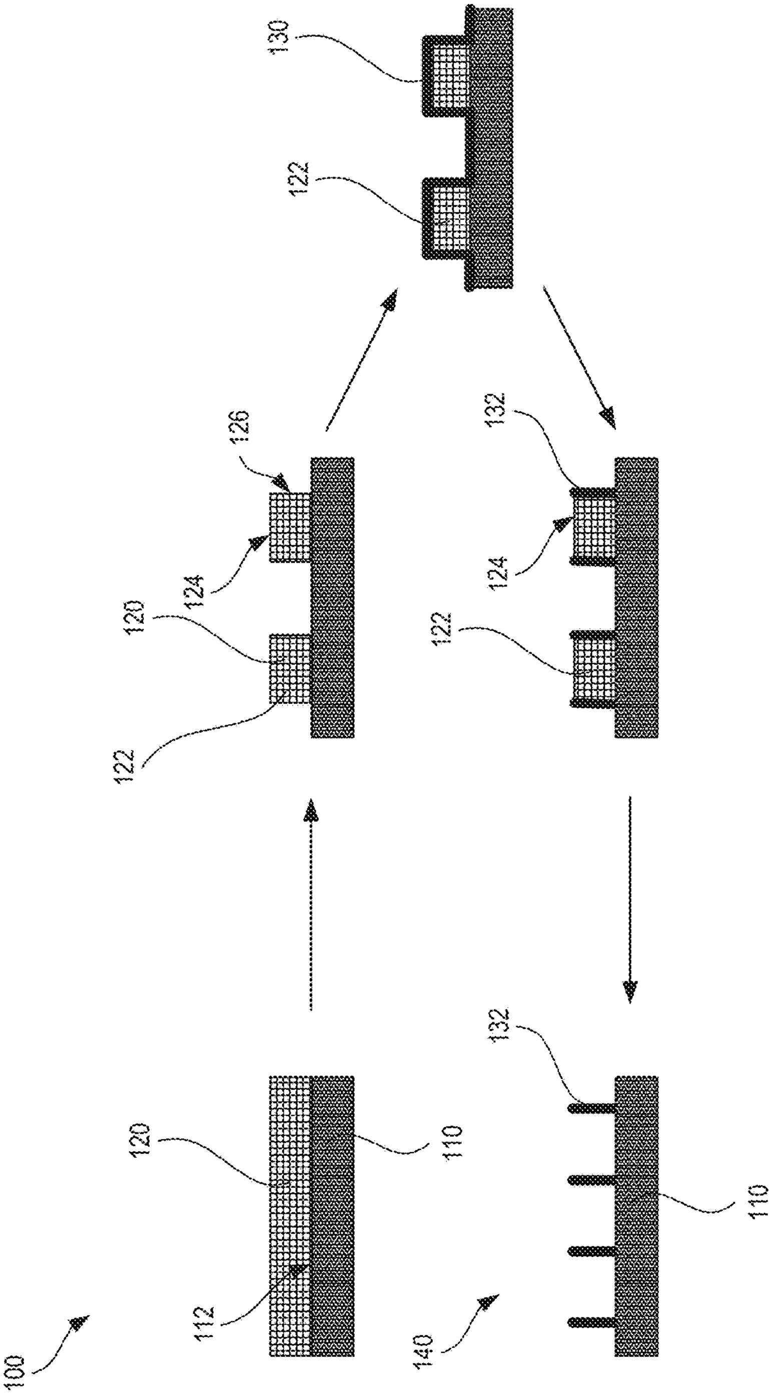
FIG. 1 is a schematic illustration of a fabrication method in accordance with an embodiment of the present disclosure.

FIG. 1 is a schematic illustration of a method of fabrication 100 in accordance with an embodiment of the present disclosure. In certain embodiments, the method 100 includes a step of obtaining a substrate material 110. Various types of substrates 110 can be used. For example, in some embodiments, the substrate 110 comprises a semiconductor material. In particular embodiments, the substrate 110 comprises a silicon wafer. Other types of substrates can also be used, and the substrate material 110 can also be various shapes and/or sizes. In some embodiments, the substrate material 110 comprises an electrode material, such that the substrate material 110 can function as an electrode (e.g., a cathode or anode) of a vacuum electronic device.

As shown in FIG. 1, the method 100 can include a step of disposing a first material 120 on or in the substrate 110. In certain embodiments, the first material 120 is disposed such that it covers at least a portion of a first surface 112 of the substrate 110. In other embodiments, the first material 120 is disposed such that substantially covers the entirety of the first surface 112 of the substrate 110.

Various types of materials (i.e., first materials) can be disposed on or in the substrate 110, and various techniques can be employed. For example, in some embodiments, the first material 120 comprises a material selected from the group consisting of silicon, silicon oxide, silicon nitride, metal (e.g., aluminum, tungsten, molybdenum, titanium, gold, palladium, chromium, nickel, etc.), and carbon. Other types of materials can also be used as the first material 120.

As previously stated, various techniques can also be employed to dispose the first material 120 in or on the substrate 110. Exemplary techniques include, but are not limited to, chemical vapor deposition ("CVD") techniques, atomic layer deposition techniques, sputter coating techniques, evaporation techniques, electroplating techniques, spin coating techniques, and spray coating techniques. Other techniques known in the art for disposing materials onto semiconductor structures can also be used. In a particular embodiment, a first material 120 comprising carbon is spun coated onto the substrate 110 to form a spin-on-carbon film or film layer.

With continued reference to FIG. 1, in some embodiments at least a portion of the first material 120 can then be removed. For example, a portion of the first material 120 can be removed to form one or more structures 122 of the first material 120. As shown in FIG. 1, the one or more structures 122 can protrude from the substrate 110, and can include a first surface 124 and a second surface 126. In certain embodiments, the first surface 124 can be a surface that is substantially planar to a surface 112 of the substrate 110. In some of such embodiments, the first surface 124 can also be described as being a top surface or a horizontal surface. The second surface 126 can be a surface that is substantially perpendicular to a surface 112 of the substrate 110. In some of such embodiments, the second surface 126 can be described as being a vertical surface.

The portion of the first material 120 can be removed in various ways. For example, in certain embodiments, the first material 120 can be patterned (e.g., lithographically patterned) and etched (e.g., vertically etched) to produce the one or more structures 122. Exemplary patterning techniques include lithographic patterning techniques such as photolithography and electron beam lithography. The first material 120 can also be masked and etched (e.g., vertically etched) to produce the one or more structures 122. For example, a masking material can be disposed on the first material 120. The masking material can also be patterned (e.g., photolithographically patterned), or in some embodiments disposed in a patterned arrangement. Illustrative masking materials that can be used include, but are not limited to, silicon oxide, silicon nitride, and metals (e.g., aluminum). In particular embodiments, a mask is disposed on the first material 120 using chemical vapor deposition techniques, such as plasma enhanced chemical vapor deposition.

In certain embodiments, the masking material can optionally be removed after the one or more structures 122 are formed (e.g., prior to disposing the second material 130). For example, the masking material can be removed by an etching or selective etching process (including, but not limited to, a wet etching (e.g., HF etching) or dry etching process (e.g., dry plasma etching)). In other embodiments, the masking material can be removed using an ion bombardment processes. Hard mask lithography or soft mask lithography ("soft lithography") can be used.

After patterning (e.g., lithographically patterning) and/or masking the first material 120 as desired, the first material 120 can be etched to remove a portion of the first material 120 and form the one or more structures 122. For example, in some embodiments, the first material 120 is vertically etched, such as with a reactive ion etching process to form the one or more structures 122. Other types of etching and/or vertical etching techniques can also be used. As can be appreciated, the one or more structures 122 can comprise the first material 120 that remains after the etching and/or removal process.

With continued reference to FIG. 1, the method 100 can further comprise a step of disposing a second material 130 onto the one or more structures 122 of the first material 120. In particular embodiments, the second material 130 is disposed onto the first and second surfaces 124, 126 of the first material 120. In certain embodiments, the second material 130 is disposed such that it forms a conformal or partially conformal layer or film on the one or more structures 122 of the first material 120. In some of such embodiments, the one or more structures 122 can be described as mandrels, or structures that can be used to provide a desired shape and/or form to the second material 130.

Various types of materials (i.e., second materials) can be disposed onto the one or more structures 122 of the first material 120, and various techniques can be employed. For example, in some embodiments, the second material 120 comprises a material selected from the group consisting of silicon, silicon oxide, silicon nitride, metal (e.g., aluminum, tungsten, molybdenum, titanium, gold, palladium, chromium, nickel), or carbon. In some embodiments, the second material 130 comprises a conductive material. In further embodiments, the second material 130 comprises a dielectric material. In some embodiments, the second material 130 differs from the first material 120. In particular embodiments, the second material 130 can be known as a spacer or sidewall material.

As previously stated, various techniques can also be employed to dispose the second material 130 onto the one or more structures 122. For example, in some embodiments, the second material 130 is disposed using chemical vapor deposition ("CVD") techniques, atomic layer deposition techniques, sputter coating techniques, evaporation techniques, electroplating techniques, spin coating techniques, or spray coating techniques. Other techniques can also be employed.

A portion of the second material 130 can then be removed. For example, in some embodiments a portion of the second material 130 is removed to expose one or more surfaces (e.g., a first surface 124) of the one or more structures 122 of the first material 120. Stated another way, in some embodiments a portion of the second material 130 is removed from the first surface 124 (e.g., a horizontal surface) of the one or more structures 122. Various techniques can be employed to remove the portion of the second material 130, including but not limited to vertical etching techniques (e.g., reactive ion etching). Other techniques can also be used. In certain embodiments, the portion of the second material 130 is removed using anisotropical etching techniques, such as anisotropically etching the second material 130 in an oxygen and argon plasma. In further embodiments, a fluorine plasma is used to etch the portion of the second material 130.

In particular embodiments, a portion of the second material 130 is removed to form one or more sidewall structures 132 of the second material 130. As shown in FIG. 1, the one or more sidewall structures 132 can protrude from the substrate 110 in a substantially perpendicular direction (or a direction that is substantially perpendicular to the surface 112 of the substrate 110). The one or more sidewall structures 132 can also be disposed on or adjacent to the second surface 126 of the one or more structures 122 of the first material 120.

After the one or more sidewall structures 132 are formed, a second portion of the first material 120 (or a portion of the one or more structures 122) can be removed to form a fabricated structure 140. For example, the second portion of the first material 120 can be removed (or selectively removed) by various etching techniques, dissolution techniques, or by another acceptable removal technique. In certain embodiments, for example, the second portion of the first material 120 is removed using anisotropical etching techniques, such as anisotropically etching the first material 120 in an oxygen (and/or oxygen and argon) plasma. In some embodiments, an etch stop material is disposed between the first and/or second material 120, 130 and the substrate 110. Use of an etch stop material can aid in preventing the etch from progressing into and/or through the substrate. The etch stop material can optionally be removed after the fabrication process (e.g., with a selective etch or dissolution material.)

As shown in FIG. 1, the resulting fabricated structure 140 comprises the substrate 110 and one or more sidewall structures 132 protruding from the substrate 110. Stated another way, the resulting fabricated structure 140 can be described as having free-standing sidewall structures 132. As can be appreciated, remnants of the first material 120 may also be included on the fabricated structure 140.

In some embodiments, the process of forming the fabricated structure 140 can include the general principles of self-aligned double patterning ("SADP"), although the methods are not limited to such principles. Further, in certain embodiments, the above-identified method steps can be repeated any number of times as desired. For example, the resulting one or more sidewall structures 132 can function as mandrel like structures analogous to the one or more structures 122 described above. Additional materials can be disposed, and additional removal processes can be employed, analogous to the method steps detailed above. In such embodiments, the method may be referred to as a quadruple patterning process.

Figure 2:
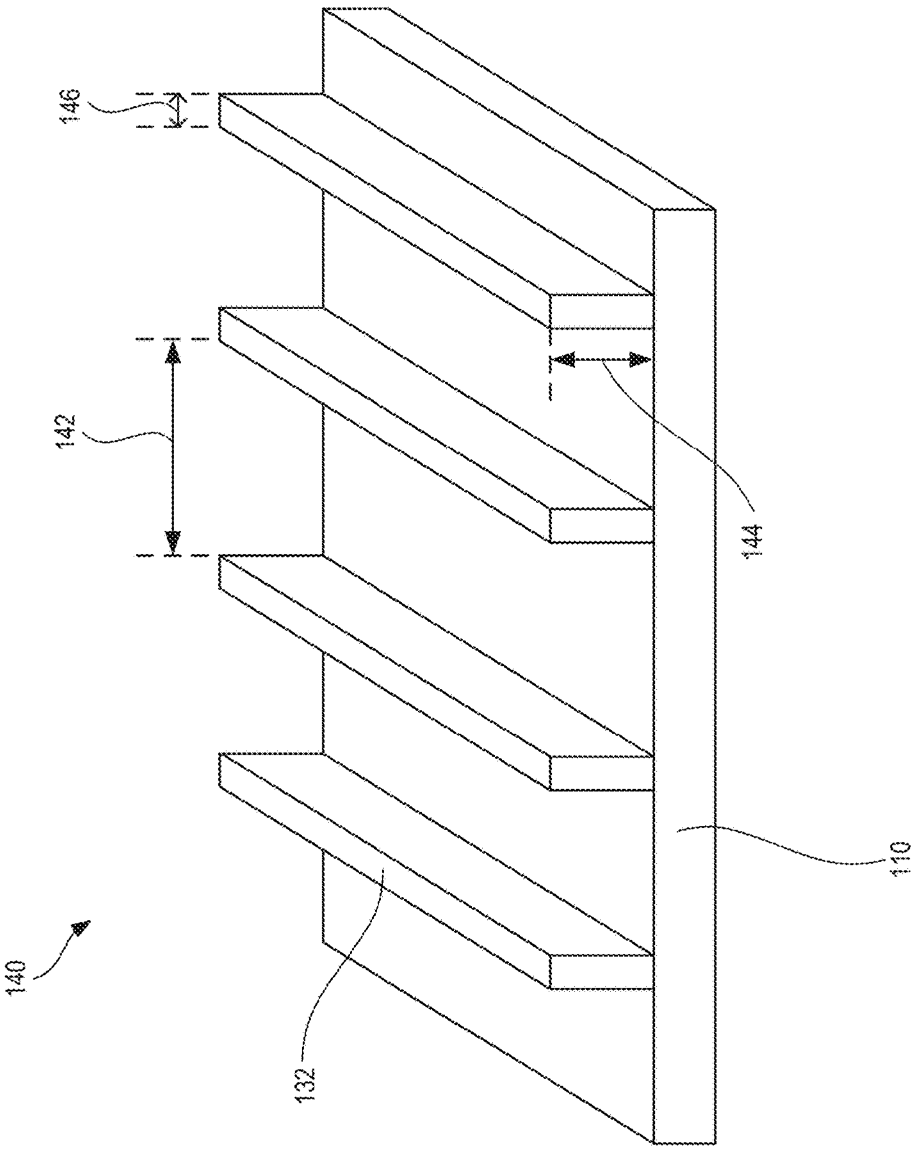
FIG. 2 is a perspective view of a fabricated structure made in accordance with the method of FIG. 1.

FIG. 2 depicts a perspective view of the fabricated structure 140 made in accordance with the method of FIG. 1. As shown in FIG. 2, it will be appreciated that the schematic illustration in FIG. 1 (and other schematic illustrations used herein) can be exemplary of a three dimensional structure. Further, while the fabricated structure 140 depicted in FIG. 2 generally includes one or more sidewall structures 132 that are parallel with one another, it will be appreciated that other shapes can also be formed. For example, it will be understood that the sidewall structures 132 can formed into any number of geometries, arrays of parallel or nonparallel lines, circles, squares, rectangles, or other polygons, grids, splines, etc. It will also be appreciated that the one or more structures 122 of first material 120 (which can also be described as mandrels) can be formed into various shapes and/or sizes to produce a desired shape and/or size of sidewall structures 132.

With continued reference to FIG. 2, the fabricated structures 140 made in accordance with the present disclosure can be advantageous in many ways. For example, the parameters (including, but not limited to, the dimensions, geometries, and/or sizes) of the features (e.g., the one or more sidewall structures 132) of the fabricated structures 140 are not determined and/or limited solely by lithographic processes. Rather, the parameters of the fabricated structures 140 are at least in part determined and defined by the thickness 146 of the sidewall structures 132, which can be tuned and/or controlled during the fabrication process. For example, the thickness 146 of the sidewall structures 132 can be tuned and/or controlled, at least in part, by the amount and/or thickness of the second material 130 that is disposed on the one or more structures 122.

The techniques for disposing the second material 130 (such as chemical vapor deposition ("CVD") techniques and atomic layer deposition techniques) can also provide reliable tuning and control of the thickness in nanometer and in some instances angstrom levels. For example, chemical vapor deposition techniques can be tuned and/or controlled at nanometer levers, and atomic layer deposition can be tuned and/or controlled at angstrom levels. Devices and components, including very small devices and components, having tuned and/or controlled parameters and/or features can thus be reliably fabricated in accordance with the methods disclosed herein, which can be advantageous over traditional lithography processes, such as direct-write lithography (e.g., photo- and stepper-lithography).

In certain embodiments, the spacing or pitch 142 between adjacent sidewall structures 132 can be determined by lithography. For example, the pitch 142 can be, at least in part, dependent upon the removal (e.g., etching) of the first material to form the one or more structures or mandrels of first material. In such embodiments, the patterning (e.g., photolithography) can be used to achieve structures and/or mandrels having desired features. In certain of such embodiments, the lithography or etching process can be used to achieve patterning techniques from about 10 nanometers to centimeter sizes. In further of such embodiments, the width or thickness 146 of the sidewall structures 132 can then be determined by the amount and/or thickness of the second material 130 that is disposed on the one or more structures.

In some embodiments, the fabricated structures 140 have features, such as sidewalls 132, that are nanometer sized (or sizes that are less than 1000 or less than 100 nanometers). In other embodiments, the fabricated structures 140 have features, such as sidewalls 132, that are micrometer sized (or sizes that are less than 1000 micrometers, or less than 100 micrometers). For example, the spacing, pitch 142 or distance between adjacent sidewall structures 132, the height 144 of the sidewall structures 132, and/or the width 146 or thickness of the sidewall structures 132 can be nanometer sized, micrometer sized, or larger depending on the desired use of the fabricated structure 140.

Notwithstanding, while the fabricated structures 140 can have features (e.g., sidewalls 132) that are nanometer to micron in size, larger sized structures can also be obtained. For example, the methods disclosed herein can also be used to fabricate relatively large structures, and almost any size and/or diameter of substrate can be used. The methods disclosed herein can also employ parallel as opposed to serial patterning techniques.

As set forth above, in some embodiments the method 100 is employed in the fabrication of a component of a vacuum electronic device. In such embodiments, the method 100 can further include a step of fabricating a component of a vacuum electronic device (or a step of fabricating a component of a vacuum electronic device on a substrate), in addition to any number of the above-identified method steps of FIG. 1. As can be appreciated, vacuum electronic devices can refer to devices that include a vacuum region. For example, in certain embodiments, vacuum electronic devices include an anode, a cathode, and a grid (such as a conductive grid).

In particular embodiments, the fabricated structure 140 is employed as the grid of a vacuum electronic device. In some of such embodiments, the method 100 further comprises a step of inserting and/or disposing the fabricated structure 140 into a vacuum electronic device, or inserting and/or disposing the fabricated structure 140 between an anode and a cathode of a vacuum electronic device.

In one illustrative embodiment, the fabricated structure 140 is used as a grid (e.g., a conductive grid), and the one or more sidewall structures 132 comprises an electrically conductive material (e.g., a metal or a conductive ceramic such as indium tin oxide). In certain embodiments, the one or more sidewall structures 132 form one or more conductive lines and/or features of a grid. In another embodiment, the fabricated structure 140 is used as an electrode-grid structure, and the fabricated structure can be disposed as an electrode in a vacuum electronic device. For example, the substrate 110 may function as an electrode (e.g., an anode), and the one or more sidewall structures 132 may function as a grid. The electrode-grid structure can be made with nanometer scale spacing, or with micron-scale spacing as desired (e.g., the pitch between the sidewall structures 132 can be nanometer or micrometer sized). In yet other embodiments, the fabricated structure 140 comprises a grid (or electrode-grid) structure that covers an area larger than 1 $mm^2$.

Exemplary vacuum electronic devices in which the fabricated structures can be used include, but are not limited to, microelectronic devices, nanoelectronic devices, thermionic converters, or electronic devices that are configured to generate electrical power. For example, the vacuum electronic device can be configured to serve as a heat pump or cooler. The vacuum electronic device can also be configured to serve as an electron emitter (e.g., field emission device), x-ray source, amplifier, rectifier, switch, display, and/or used in other vacuum electronic applications such as travelling wave tubes, inductive output tubes, accelerators, mass spectrometers, thrusters, electric thrusters, ion thrusters, klystrons, gyrotrons, or electron lasers.

Other uses of the fabricated structure 140 are also contemplated. For example, in some embodiments, the fabricated structure 140 can be used as a template for additional lithography techniques. For example, in some embodiments, the fabricated structure 140 can be used as a stamp or template for nanoimprint lithography. In other embodiments, the fabricated structure 140 can be used as an etch mask for subtractive etching (e.g., subtractive vertical etching of a stack of materials). The fabricated structure 140 can also be used as a support structure. The fabricated structure 140 can also be used in other applications. In certain embodiments, the fabricated structure 140 is used to fabricate grids or other vacuum electronic components such as those described in U.S. patent application Ser. No. 14/939,743, filed Nov. 12, 2015, and titled Fabrication of Nanoscale Vacuum Grid and Electrode Structure With High Aspect Ratio Dielectric Spacers Between the Grid and Electrode, which is incorporated by reference herein in its entirety.

Figure 3:
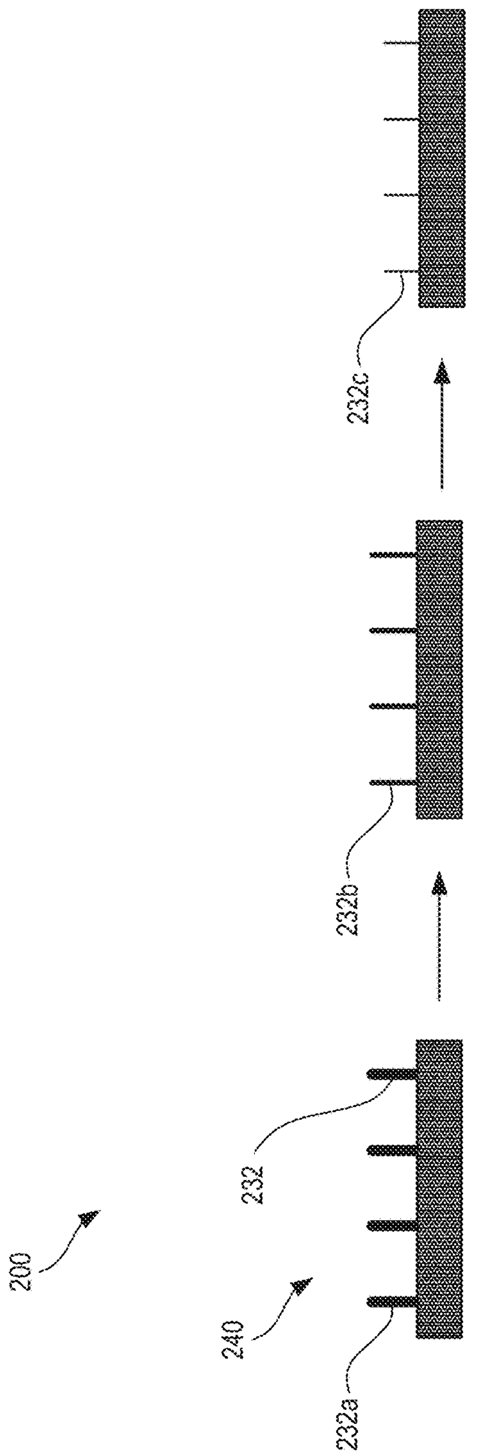
FIG. 3 is a schematic illustration of a method of fabrication in accordance with another embodiment of the present disclosure.

FIG. 3 depicts a method of fabrication 200 in accordance with another embodiment of the present disclosure. As shown in FIG. 3, a fabricated structure 240, which can be analogous to the fabricated structure 140 made in accordance with the embodiment described above in FIG. 1, can be subjected to additional fabrication steps. For example, in some embodiments, the height and/or width of the one or more sidewall structures 232 of the fabricated structure 240 can be further modified or reduced. In certain embodiments, the one or more sidewall structures 232 can be reduced by etching. For example, the one or more sidewall structures 232 can be reduced by dry or wet etching techniques, including, but not limited to vertical and/or anisotropic etching (e.g., anisotropic dry etching). Through the etching process, a portion of the one or more sidewall structures 232 can be removed. Other techniques for removing a portion of the one or more sidewall structures 232 can also be used.

FIG. 3 is illustrative of an etching (or reducing process) over time. As time progresses, the width and/or height of the one or more sidewall structures is reduced, as is represented by the change in width and height of sidewall structure 232*a* as compared to sidewall structure 232*b* and as further compared to sidewall structure 232*c*. In such embodiments, the size, dimensions, and/or features of the fabricated structure 240 can be further tuned, controlled and/or changed as desired.

In some embodiments, the reduced fabricated structure 240 can be used as a vacuum electronic component, such as a grid. In other embodiments, the reduced fabricated structure 240 is further employed in additional methods disclosed herein. For example, the reduced fabricated structure 240 can be employed in nanoimprint lithography (such as the methods disclosed in FIG. 4). The reduced fabricated structure 240 can also be employed as an etch mask for subtractive etching (such as the methods disclosed in FIG. 5).

Figure 4:
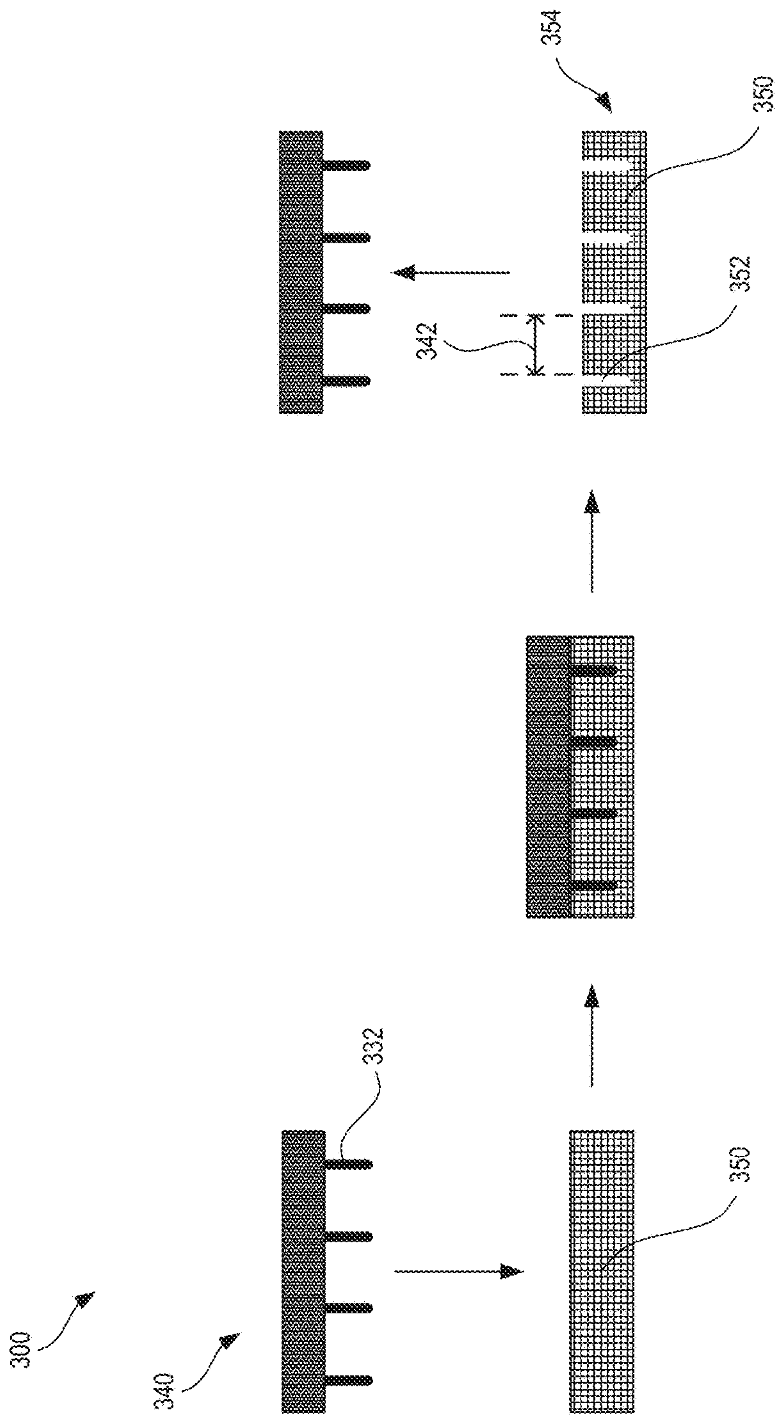
FIG. 4 is a schematic illustration of a method of fabrication in accordance with another embodiment of the present disclosure.

FIG. 4 depicts a method of fabrication 300 in accordance with another embodiment of the present disclosure. As shown in FIG. 4, a fabricated structure 340 can be employed as a template or stamp for imprint (or nanoimprint) lithography. As shown in FIG. 4, the fabricated structure 340 can be pressed and/or mechanically imprinted into an imprint material 350 to be imprinted. Exemplary imprint materials 350 include, but are not limited, to polymer materials. As shown in FIG. 4, after the imprinting process, which can include heating, photo curing, and/or other imprinting processes, the fabricated structure 340 can be removed to form a template comprising the imprinted structure 354. The imprinted structure 354 includes voids or imprints 352 that correspond to the one or more sidewall structures 332 of the fabricated structure 340.

In certain embodiments, the imprints 352 are nanometer sized (or sizes that are less than 1000 or less than 100 nanometers in size). In other embodiments, the imprints 352 are micrometer sized (or sizes that are less than 1000 micrometers, or less than 100 micrometers in size). In further embodiments, the spacing or pitch 342 between imprints 352 is nanometer sized (or sizes that are less than 1000 or less than 100 nanometers in size), micrometer sized (or sizes that are less than 1000 micrometers, or less than 100 micrometers in size), or millimeter sized.

The template having an imprinted structure 354 can also be used in various ways. For example, in some embodiments, the template having an imprinted structure 354 is employed in patterning a component of a vacuum electronic device, such as a grid. For example, the imprinted structure 354 can be used to define a pattern for fabricating a component of a vacuum electronic device.

Figure 5:
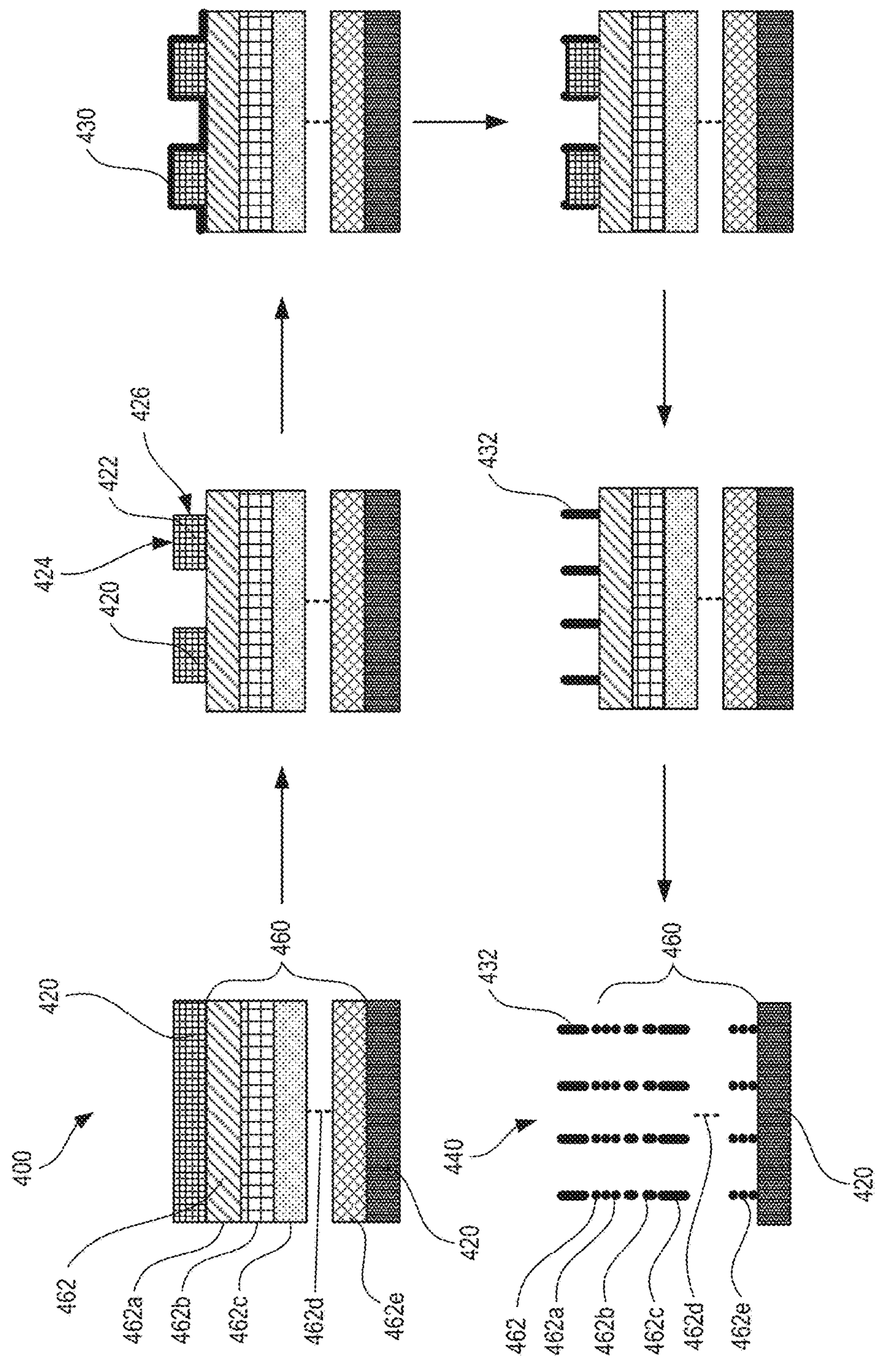
FIG. 5 is a schematic illustration of a method of fabrication in accordance with another embodiment of the present disclosure.

FIG. 5 is a schematic of another method of fabrication 400. The method 400 and associated structures can, in certain respects, resemble components of the method 100 and associated structures described in connection with FIG. 1 above. It will be appreciated that the illustrated embodiments may have analogous features. Accordingly, like features are designated with like reference numerals, with the leading digits incremented to "4." (For instance, the sidewall structures are designated "132" in FIG. 1, and analogous sidewall structures are designated as "432" in FIG. 5.) Relevant disclosure set forth above regarding similarly identified features thus may not be repeated hereafter. Moreover, specific features of the method 400 and associated structures and related components shown in FIG. 5 may not be shown or identified by a reference numeral in the drawings or specifically discussed in the written description that follows. However, such features may clearly be the same, or substantially the same, as features depicted in other embodiments and/or described with respect to such embodiments. Accordingly, the relevant descriptions of such features apply equally to the features of the methods of FIG. 5. Any suitable combination of the features, and variations of the same, described with respect to the method 100 and associated structures and components illustrated in FIG. 1, can be employed with the method 400 and associated structures and components of FIG. 5, and vice versa. This pattern of disclosure applies equally to further embodiments disclosed herein.

As shown in FIG. 5, in some embodiments, the fabrication method 400 includes use of the one or more sidewall structures 432 as an etch mask for subtractive etching (e.g., subtractive vertical etching of a stack of materials 460). As shown in FIG. 5, in some embodiments one or more layers of additional materials or films 462*a*, 462*b*, 426*c*, 462*d*, 462*e* are disposed between the first material 420 and the substrate 410. Any number of films or materials 462 can be disposed in this manner. In some embodiments, these layers or films 462 can be referred to as a film stack 460. In some embodiments, the one or more layers 462 comprises at least one of silicon nitride, silicon oxide, or aluminum oxide. In further embodiments, at least one layer (such as layer 462*e* of the film stack 460) comprises an etch stop material. For example, the etch stop material can be configured to stop an etch from progressing past the material. Exemplary etch stop materials include, but are not limited to, lanthanum compounds (e.g., lanthanum hexaboride ($LaB_6$)), cerium compounds (e.g., cerium hexaboride ($CeB_6$)), barium compounds, tungsten compounds, tantalum compounds, silicon compounds (e.g., silicon carbide (SiC)), electron emissive materials, refractory metals, and ceramics. Other etch stop materials can also be used.

Analogous to the method described above in relation to FIG. 1, a portion of the first material 420 can be removed to form one or more structures 422 of the first material 420. Each of the one or more structures protruding from the film stack 460, and having a first surface 424 and a second surface 426. A second material 430 can then be disposed (e.g., conformally disposed) on the one or more structures 422 of the first material 420, after which a portion of the second material 430 can be removed. For example, a portion of the second material 430 can be removed from the first surface 424 of the one or more structures 422 to form one or more sidewall structures 432 of the second material 430. The one or more sidewall structures 430 can be disposed on or adjacent to the second surface 426 of the one or more structures 422 of the first material 420. Analogous to the method of FIG. 1, a second portion of the one or more structures 422 can then be removed to form a fabricated structure comprising a substrate 410, the film stack 460, and the one or more sidewalls 432.

In certain embodiments, the one or more sidewalls 432 can then serve as a mask for additional etchings processes. For example, as shown in FIG. 5, the method can include further etching (e.g., subtractive vertical etching) of the stack materials 460. The resulting structure 440 includes a film stack 460 (or other layered stack) that is patterned after the one or more sidewall structures 432. As can be appreciated, the dashed lines in the layers 462*a*, 462*b*, 426*c*, 462*d*, 462*e* of the resulting structure 440 are intended to depict the different layers, and are not necessarily intended to indicate that the layers 462*a*, 462*b*, 426*c*, 462*d*, 462*e* are discontinuous or have been horizontally etched.

The resulting structure 440 can be used in any of the various ways described above with respect to the fabricated structure 140 of FIG. 1. For example, in some embodiments, the resulting structure 440 is employed as a component of a vacuum electronic device, such as a grid. In further embodiments, the resulting structure 440 can be used as an electrode-grid structure.

Figure 6:
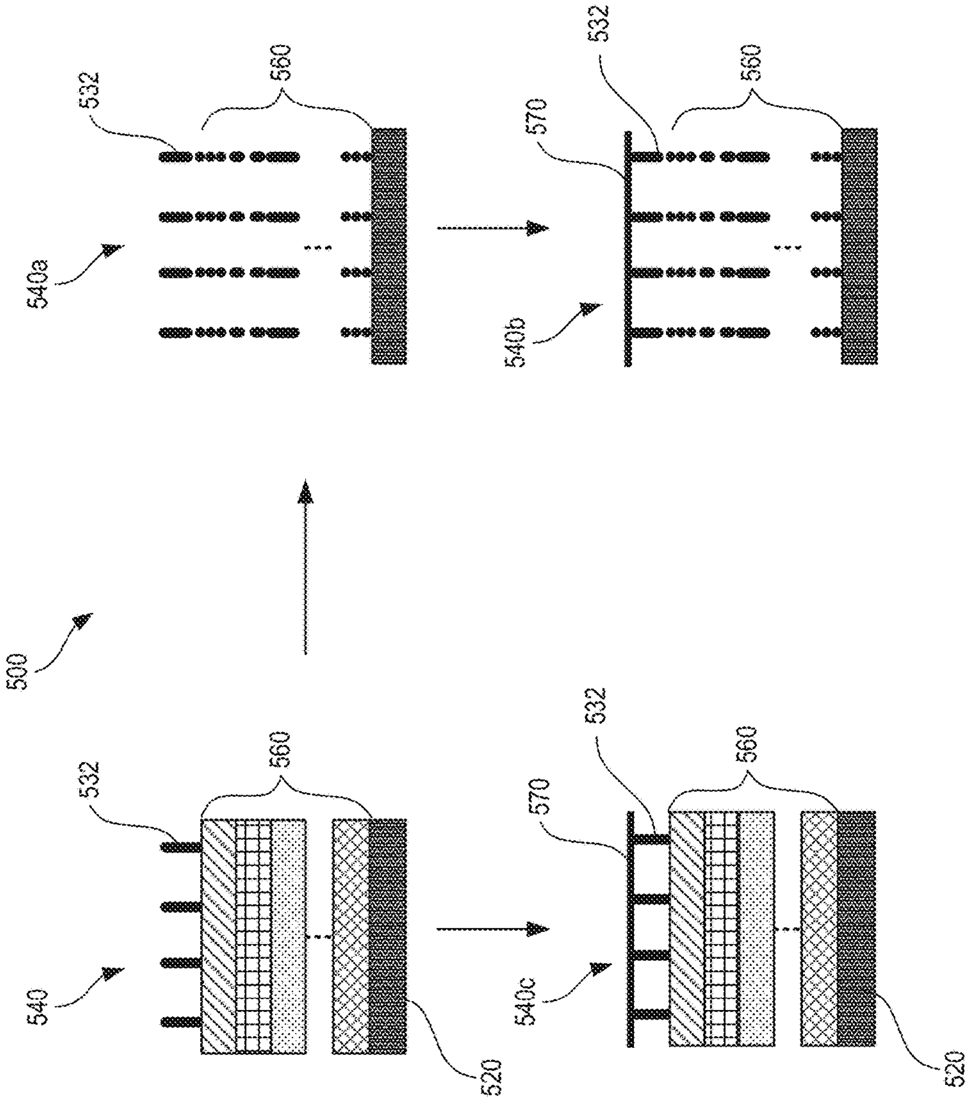
FIG. 6 is a schematic illustration of a method of fabrication in accordance with another embodiment of the present disclosure.

FIG. 6 depicts a schematic fabrication method 500 in accordance with another embodiment of the present disclosure. As shown in FIG. 6, in some embodiments, the fabricated structure 540, which can be fabricated in accordance with the methods described herein, can be used as a support structure. For example, in certain embodiments, the fabricated structure 540, which optionally can include a film stack 560 or other material layers can be vertically etched (such as using the methods disclosed in FIG. 5) to form a vertically etched film structure 540*a*. The one or more sidewall structures 532 can then be used as a support for another material 570 to form the fabricated support structure 540*b*.

In other embodiments, the fabricated structure 540, which optionally can include a film stack 560 or other material layers can be used as a support for another material or layer (e.g., film layer) 570 to form the fabricated support structure 540*c*. Illustrative materials that can be used in supported layer 570 include, but are not limited to, carbon nanotube ("CNT") mesh, graphene, layered graphene/graphite, molybdenum compounds (e.g., molybdenum disulfide ($MoS_2$)), tungsten compounds (e.g., tungsten disulfide ($WS_2$)) and tungsten diselenide ($WSe_2$)). In further embodiments, the supported material 570 or layer can include a material having a porous network. The supported material 570 can also include conductive materials and/or nanomaterials. The supported material 570 can also be disposed on the sidewall structures 532 in various ways, including solution-phase deposition techniques. In some embodiments, the supported material 570 is suspended by the one or more support structures 532.

The fabricated structures 540 (including the supported material 570) can be used in any of the various ways described above with respect to the fabricated structure 140 of FIG. 1. For example, in some embodiments, the fabricated structure 540 (including the supported material 570) is employed as a component of a vacuum electronic device, such as a grid. In further embodiments, the fabricated structure 540 (including the supported material 570) can be used as an electrode-grid structure. In still further embodiments, the supported material 570 is used as a component of a vacuum electronic device, such as a grid. Other uses are also contemplated.

EXAMPLES

The following examples are illustrative of embodiments of the present disclosure, as described above, and are not meant to be limiting in any way.

Example 1

A fabricated structure comprising one or more sidewall structures protruding from a substrate was fabricated in accordance with the methods disclosed herein. In particular, a first material (carbon) was disposed on a substrate using spin-coating techniques to form a spin-on-carbon layer or spin-on-carbon film layer. A 50 nm thick silicon oxide film mask was then disposed on the spin-on-carbon layer using plasma enhanced chemical vapor deposition techniques ("PECVD"). Photolithography was then used to pattern the silicon oxide film mask, and a first portion of the spin-on-carbon material was vertically/anisotropically etched in an oxygen and argon plasma to form a plurality of vertical spin-on-carbon structures. Next, the silicon oxide film mask was removed using a solution-based wet HF (hydrofluoric acid) etch.

The spin-on-carbon structures were used as mandrels, and a second material (silicon nitride) was disposed on the spin-on-carbon structures using plasma enhanced chemical vapor deposition techniques ("PECVD"). The silicon nitride material was then vertically/anisotropically etched in a fluorine plasma to expose a surface of the spin-on-carbon structures. Then a second portion of the spin-on-carbon structures was etched using an oxygen plasma etch to form free-standing silicon nitride sidewall structures.

Figure 7A:
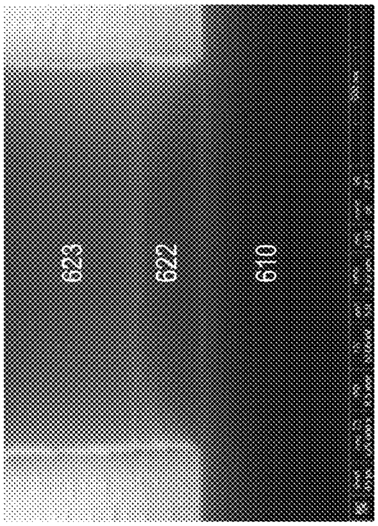
FIGS. 7A-7D depict scanning electron microscope ("SEM") images of a method of fabrication in accordance with an embodiment of the present disclosure.
Figure 7B:
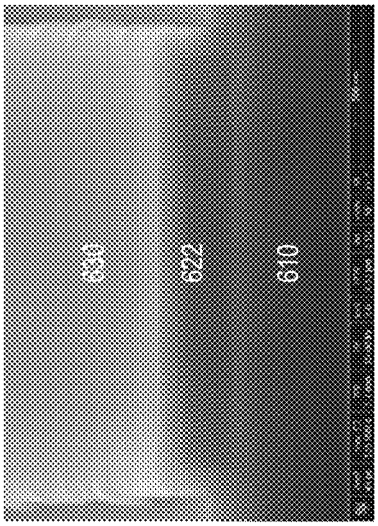
Figure 7C:
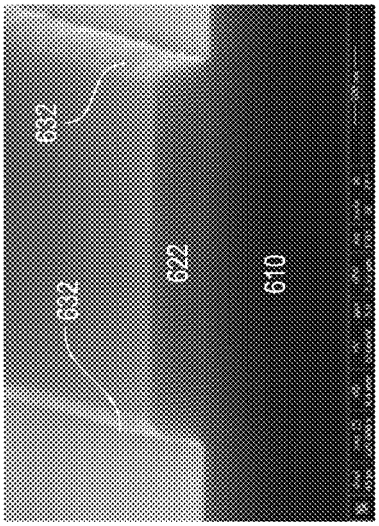
Figure 7D:
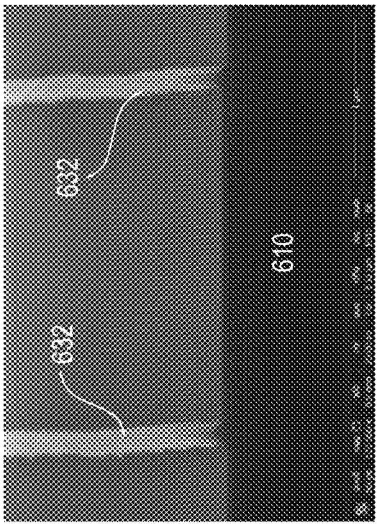
Figure 8:
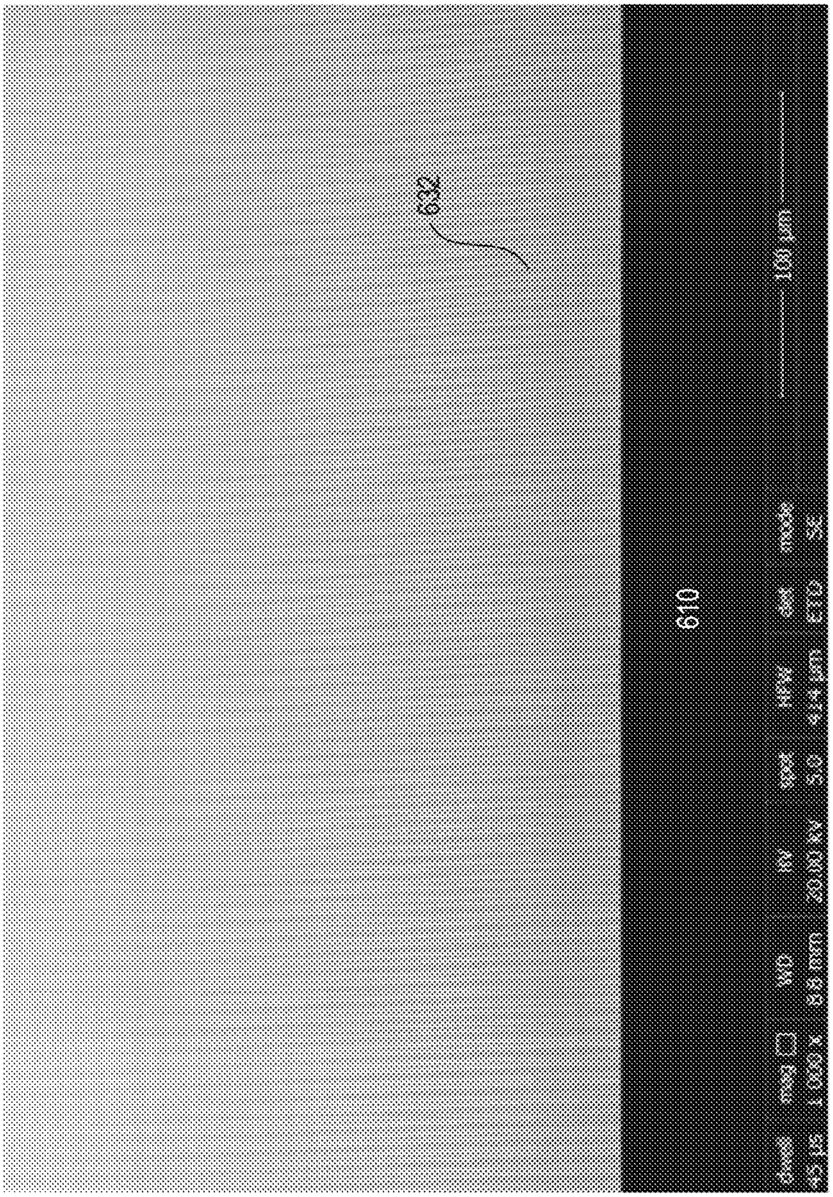
FIG. 8 is a scanning electron microscope ("SEM") image of a fabricated structure made in accordance with a method of the present disclosure.

A scanning electron microscope ("SEM") image of this process are presented in FIGS. 7A-7D. In particular, FIG. 7A depicts the spin-on-carbon structures 622 with the silicon oxide mask 623 after the first vertical etching step. As further shown in FIG. 7A, the spin-on-carbon structures 622 are disposed on a substrate 610. FIG. 7B depicts a conformal layer of silicon nitride material 630 after being disposed on the spin-on-carbon structures 622. FIG. 7C depicts silicon nitride sidewalls 632 formed on the spin-on-carbon structures 622 following the second vertical etch step. FIG. 7D depicts the free-standing silicon nitride sidewall structures 632 following removal of the spin-on-carbon structures. FIG. 8 is a relatively lower-magnification scanning electron microscope ("SEM") image of a fabricated structure having a plurality of sidewall structures 632 disposed on a substrate 610.

Example 2

A fabricated structure having one or more sidewalls was obtained in accordance with Example 1. The one or more sidewalls were then further reduced by etching. In particular, the height and/or width of the one or more sidewalls were reduced by etching. Specifically, silicon nitride reactive ion etches were performed for different amounts of time on silicon nitride sidewalls.

Figure 9A:
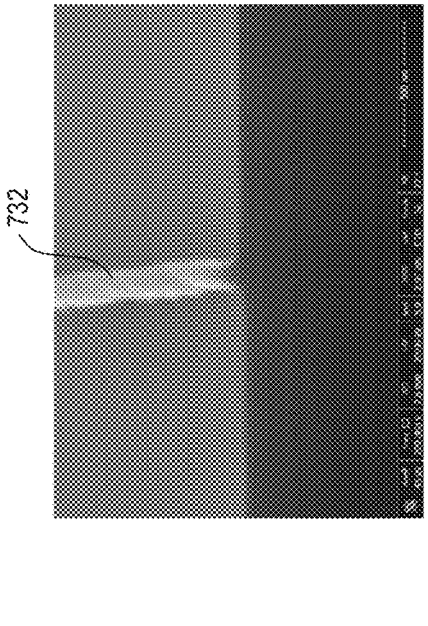
FIGS. 9A-9F depict scanning electron microscope ("SEM") images of a method of fabrication in accordance with another embodiment of the present disclosure.
Figure 9B:
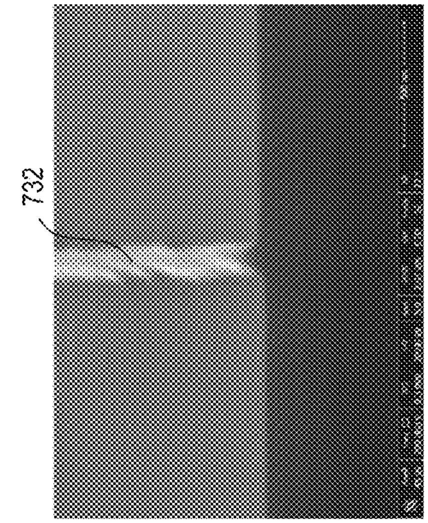
Figure 9C:
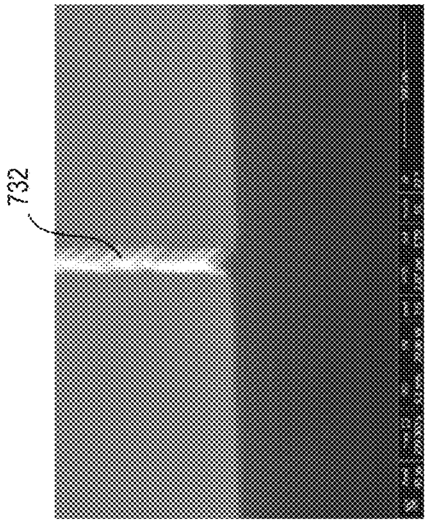
Figure 9D:
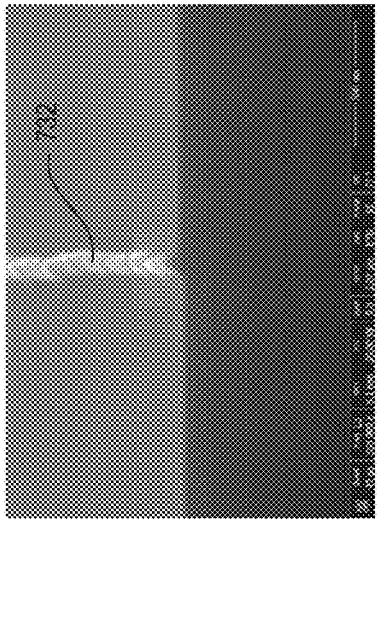
Figure 9E:
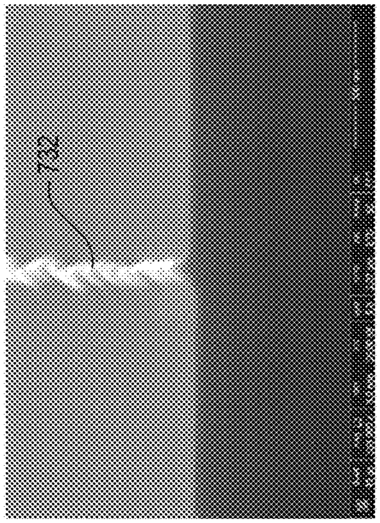
Figure 9F:
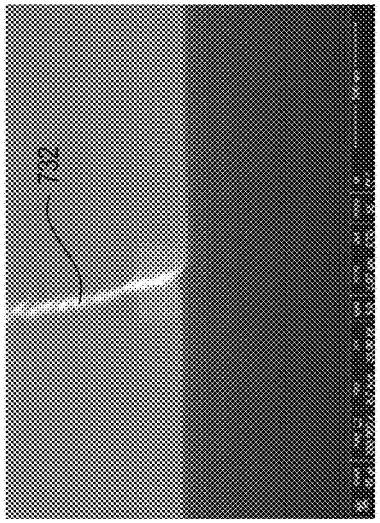

FIGS. 9A-9F depict scanning electron microscope ("SEM") images of the reduced sidewall structures 732. In particular, FIGS. 9A-9F depict various images of the silicon nitride sidewall structures 732 after having been etched for increasing amounts of time (with FIG. 9A representing the least amount of etching time, and FIG. 9F representing the largest amount of etching time). As shown in FIGS. 9A-9F, the thickness or width of the sidewall structures 732 was reduced as the etching time increased.

Example 3

A fabricated structure comprising one or more sidewall structures was fabricated in accordance with the methods disclosed herein. First, aluminum sidewall structures were fabricated on one or more layered materials (e.g., a film stack) in accordance with the methods disclosed herein. The one or more layered materials (e.g., film stack) included a lanthanum hexaboride layer disposed on the substrate to serve as an etch stop. A silicon nitride layer was also disposed between the lanthanum hexaboride layer and the aluminum sidewall structures.

Figure 10:
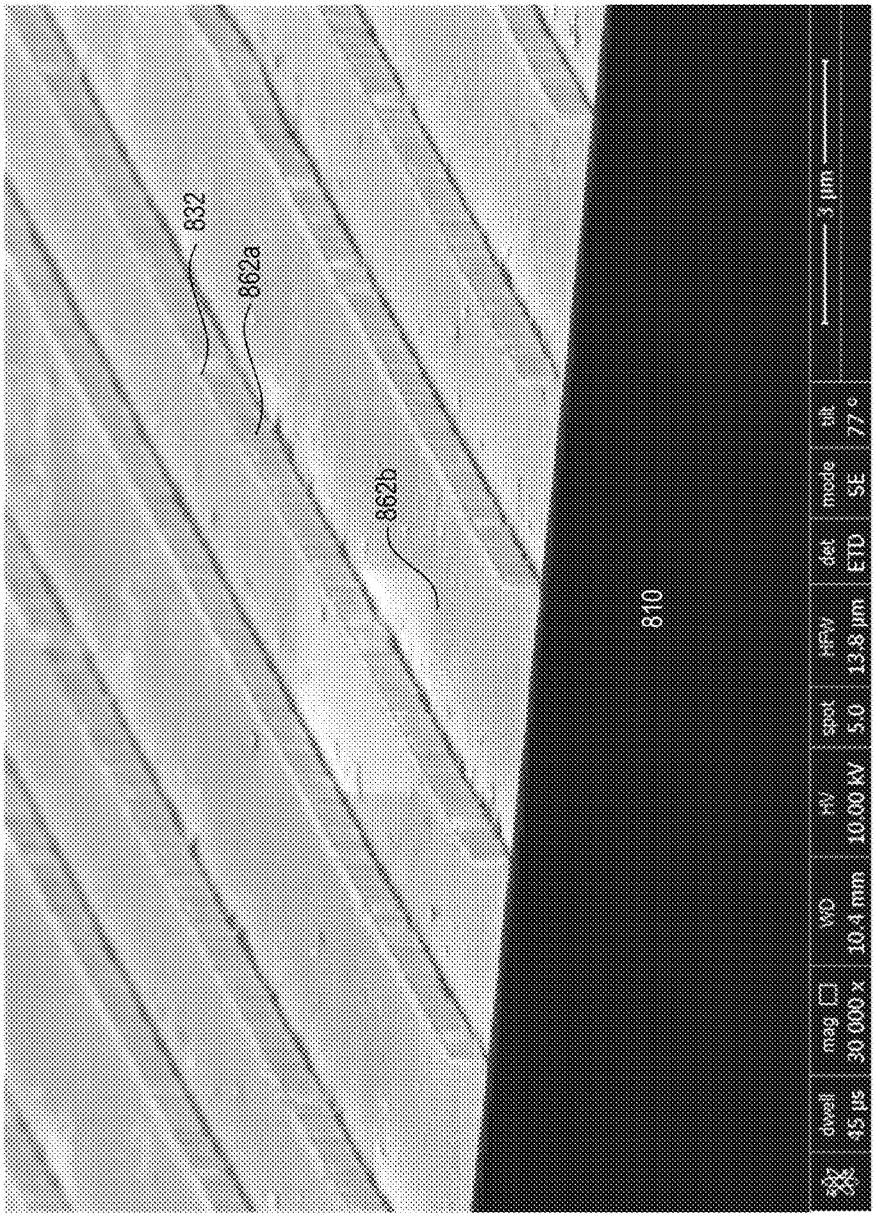
FIG. 10 depicts a scanning electron microscope ("SEM") image of a fabricated structure made in accordance with a method of the present disclosure.

With the aluminum sidewall structures serving as an etch mask, the silicon nitride layer was subtractively etched until reaching the lanthanum hexaboride etch stop layer. A scanning electron microscope ("SEM") image of the resulting structure is depicted in FIG. 10. As shown in FIG. 10, the resulting structure included aluminum sidewall structures 832 disposed on silicon nitride structures 862*a*, which were patterned after the aluminum sidewall structures 832. The silicon nitride structures 862*a* were further disposed on a lanthanum hexaboride layer 862*b*, which was disposed on a substrate 810.

Reference throughout this specification to "an embodiment" or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Additionally, references to ranges include both endpoints.

Similarly, it should be appreciated that in the above description of embodiments, various features are sometimes grouped together in a single embodiment, figure, or description thereof for the purpose of streamlining the disclosure. This method of disclosure, however, is not to be interpreted as reflecting an intention that any claim require more features than those expressly recited in that claim. Rather, as the following claims reflect, inventive aspects lie in a combination of fewer than all features of any single foregoing disclosed embodiment.

The claims following this written disclosure are hereby expressly incorporated into the present written disclosure, with each claim standing on its own as a separate embodiment. This disclosure includes all permutations of the independent claims with their dependent claims. Moreover, additional embodiments capable of derivation from the independent and dependent claims that follow are also expressly incorporated into the present written description.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of fabricating a component of a vacuum electronic device, the method comprising:

fabricating a component of a vacuum electronic device on or in a substrate, comprising:
- disposing a first material on or in the substrate;
- removing a portion of the first material to form one or more structures of the first material, each of the one or more structures protruding from the substrate and having a first surface and a second surface;
- disposing a second material onto the first and second surfaces of the one or more structures of the first material;
- removing a portion of the second material from the first surface of the one or more structures to form one or more sidewall structures of the second material, the one or more sidewall structures being disposed on the second surface of the one or more structures of the first material;
- removing a second portion of the one or more structures of the first material to form a fabricated structure comprising the substrate and one or more sidewall structures protruding from the substrate; and
- disposing a third material onto the one or more sidewall structures, wherein the third material is suspended by the one or more support structures.

2. The method of claim 1, further comprising:

disposing the fabricated structure into a vacuum electronic device.

3. The method of claim 1, further comprising:

disposing the fabricated structure as an electrode of a vacuum electronic device.

4. The method of claim 1, wherein the fabricated structure comprises a grid configured for a vacuum electronic device.

5. The method of claim 1, wherein the fabricated structure comprises a grid and an anode configured for a vacuum electronic device.

6. The method of claim 1, wherein the first material comprises a material selected from the group consisting of silicon, silicon oxide, silicon nitride, metal, aluminum, tungsten, molybdenum, titanium, gold, palladium, chromium, nickel, and carbon.

7. The method of claim 1, wherein disposing the first material on or in the substrate comprises at least one of chemical vapor deposition, atomic layer deposition, sputter coating, evaporation, electroplating, spin coating, or spray coating.

8. The method of claim 1, further comprising patterning or masking the first material prior to the step of removing the portion of the first material.

9. The method of claim 1, wherein removing the portion of the first material comprises etching the portion of the first material.

10. The method of claim 1, wherein the second material is conformally disposed on the one or more structures of the first material.

11. The method of claim 1, wherein the second material comprises a material selected from the group consisting of silicon, silicon oxide, silicon nitride, metal, aluminum, tungsten, molybdenum, titanium, gold, palladium, chromium, nickel, and carbon.

12. The method of claim 1, wherein the second material differs from the first material.

13. The method of claim 1, wherein removing a portion of the second material comprises etching the second material.

14. The method of claim 1, wherein the fabricated structure comprises a plurality of sidewall structures.

15. The method of claim 1, further comprising removing a second portion of the one or more sidewall structures to reduce a width of the one or more sidewall structures.

16. The method of claim 1, further comprising:

imprinting an imprint material with the fabricated structure to form a template comprising an imprinted structure.

17. The method of claim 16, further comprising removing a second portion of the one or more sidewall structures to reduce a width of the one or more sidewall structures prior to the imprinting step.

18. The method of claim 1, wherein the substrate comprises a stack of materials, the method further comprising:

etching the stack of materials to form the component of the vacuum electronic device, wherein the one or more sidewall structures define an etch pattern of the stack of materials.

19. The method of claim 18, wherein removing the portion of the first material comprises etching the portion of the first material.

20. The method of claim 18, wherein removing a portion of the second material comprises etching the second material.

21. The method of claim 1, wherein the third material comprises a grid configured for a vacuum electronic device.

22. The method of claim 1, wherein the third material comprises a material selected form the group consisting of carbon nanotube ("CNT") mesh, graphene, layered graphene/graphite, molybdenum compounds, and tungsten compounds.

23. The method of claim 1, further comprising removing a second portion of the one or more sidewall structures to reduce a width of the one or more sidewall structures prior to disposing the third material onto the one or more sidewall structures.

* * * * *